(12) United States Patent
Aharonov et al.

(10) Patent No.: US 11,906,052 B2
(45) Date of Patent: Feb. 20, 2024

(54) COATED PISTON RING FOR AN INTERNAL COMBUSTION ENGINE

(71) Applicant: TENNECO INC., Lake Forest, IL (US)

(72) Inventors: Robert Reuven Aharonov, West Bloomfield, MI (US); Marc Irrgeher, Manitowoc, WI (US)

(73) Assignee: Tenneco Inc., Lake Forest, IL (US)

( * ) Notice: Subject to any disclaimer, the term of this patent is extended or adjusted under 35 U.S.C. 154(b) by 0 days.

(21) Appl. No.: 17/824,096

(22) Filed: May 25, 2022

(65) Prior Publication Data

US 2023/0008886 A1    Jan. 12, 2023

Related U.S. Application Data

(62) Division of application No. 16/564,852, filed on Sep. 9, 2019, now Pat. No. 11,365,806.

(51) Int. Cl.
*F16J 9/26*      (2006.01)
*C23C 14/06*     (2006.01)

(52) U.S. Cl.
CPC ............. *F16J 9/26* (2013.01); *C23C 14/0605* (2013.01); *C23C 14/0641* (2013.01)

(58) Field of Classification Search
CPC ...... F16J 9/26; C23C 14/0605; C23C 14/0641
See application file for complete search history.

(56) References Cited

U.S. PATENT DOCUMENTS

| | | | |
|---|---|---|---|
| 9,810,323 B2 * | 11/2017 | Da Rocha Mordente . | F16J 9/26 |
| 2015/0091255 A1 * | 4/2015 | Issler ........................ | F02F 5/00 427/235 |
| 2016/0122862 A1 * | 5/2016 | Lammers ............ | C23C 14/0641 427/249.1 |
| 2018/0283553 A1 * | 10/2018 | Smith ................... | C23C 28/042 |

* cited by examiner

*Primary Examiner* — Gilbert Y Lee
(74) *Attorney, Agent, or Firm* — Robert L. Stearns; Dickinson Wright PLLC

(57) ABSTRACT

A piston ring with a coated outer surface is provided. The coating is disposed on end sections of the outer surface adjacent a gap. Typically, a middle section of the outer surface located between the end sections is not coated. The coating can be formed of CrN or DLC, and the CrN coating can be applied by physical vapor deposition (PVD). The end sections of the outer surface, upon which the coating is applied, are rough. For example, the outer surface can be blasted or otherwise textured to achieve the rough surface. The rough surface retains oil and distributes stress better than a smooth surface, and thus reduces crazing and flaking of the coating.

8 Claims, 2 Drawing Sheets

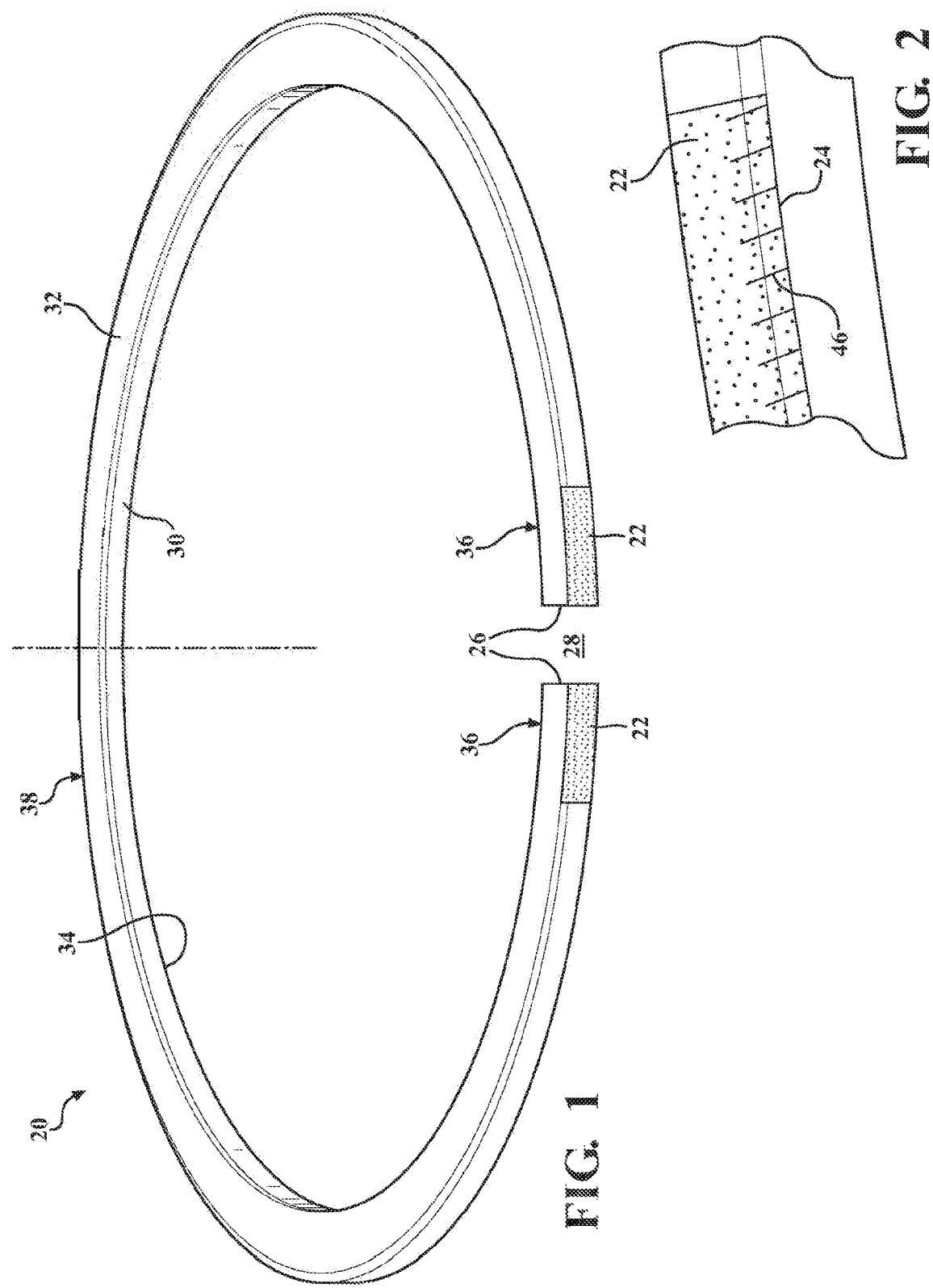

COATED PISTON RING FOR AN INTERNAL COMBUSTION ENGINE

CROSS-REFERENCE TO RELATED APPLICATION

This U.S. Divisional patent application claims priority to U.S. Utility patent application Ser. No. 16/564,852, filed Sep. 9, 2019, the entire contents of which are incorporated herein by reference.

BACKGROUND OF THE INVENTION

1. Field of the Invention

The present invention relates generally to a piston for an internal combustion engine, a piston ring for providing a seal between the piston and a cylinder wall of the engine, and methods of manufacturing the same.

2. Related Art

Typical internal combustion engines are provided with at least one piston assembly which reciprocates within a cylinder of an engine block. In general, each piston assembly includes a piston body with a plurality of ring grooves, each of which typically receives and operably supports a piston ring. In operation, the piston rings remain in the ring grooves and travel with their respective piston bodies in a reciprocating motion within cylinders of an engine block. Among other things, the pistons rings function to seal combustion gasses in a combustion chamber above the piston body, to transfer heat from the piston body to the cylinder wall, to restrict the passage of oil from the crank case to the combustion chamber and to provide a generally uniform oil film on the cylinder wall. Piston rings are oftentimes coated to improve performance and/or reduce wear and damage to the piston ring. However, over time, due to the harsh conditions of the engine, the coating can experience flaking and crazing.

SUMMARY

One aspect of the present invention provides a coated piston ring for a piston assembly of an internal combustion engine which is less prone to flaking and crazing. The piston ring comprises a ring body extending circumferentially around a center axis between opposite end surfaces, and the end surfaces of the ring body present a gap therebetween. The ring body has an outer surface facing away from the center axis, the outer surface includes end sections adjacent the end surfaces, and the end sections of the outer surface are rough. A coating is disposed on the end sections of the outer surface, and the coating includes chromium nitride (CrN) or diamond-like carbon (DLC).

Another aspect of the invention provides a piston assembly for an internal combustion engine. The piston assembly includes a piston body including at least one ring groove extending circumferentially around a center axis, and a ring body disposed in one of the at least one ring groove. The ring body extends circumferentially around the center axis between opposite end surfaces, and the end surfaces of the ring body present a gap therebetween. The ring body has an outer surface facing away from the center axis, the outer surface includes end sections adjacent the end surfaces, and the end sections of the outer surface are rough. A coating is disposed on the end sections of the outer surface, and the coating includes chromium nitride (CrN) or diamond-like carbon (DLC).

Yet another aspect of the invention provides a method of manufacturing a piston ring. The method comprises the steps of providing a ring body extending circumferentially around a center axis between opposite end surfaces, wherein the end surfaces present a gap therebetween, and the ring body has an outer surface facing away from the center axis. The method further includes texturing end sections of the outer surface located adjacent the end surfaces so that the end sections of the outer surface are rough; and applying a coating to the rough end sections of the outer surface, wherein the coating includes chromium nitride (CrN) or diamond-like carbon (DLC).

Another aspect of the invention provides a method of manufacturing a piston assembly. The method comprises providing a piston body including at least one ring groove extending circumferentially around a center axis, and providing a ring body extending circumferentially around the center axis between opposite end surfaces. The end surfaces of the ring body present a gap therebetween, and the ring body has an outer surface facing away from the center axis. The method further includes texturing end sections of the outer surface adjacent the end surfaces so that the end sections of the outer surface are rough, applying a coating to the rough end sections of the outer surface, wherein the coating includes chromium nitride (CrN) or diamond-like carbon (DLC), and disposing the coated piston ring in one of the at least one ring groove of the piston body.

BRIEF DESCRIPTION OF THE DRAWINGS

These and other features and advantages of the present invention will be readily appreciated, as the same becomes better understood by reference to the following detailed description when considered in connection with the accompanying drawings wherein:

FIG. 1 is a perspective view of a piston ring according to an exemplary embodiment;

FIG. 2 is an enlarged cross-sectional view of the piston ring of FIG. 1.

DETAILED DESCRIPTION OF THE EXAMPLE EMBODIMENTS

Figure 3:
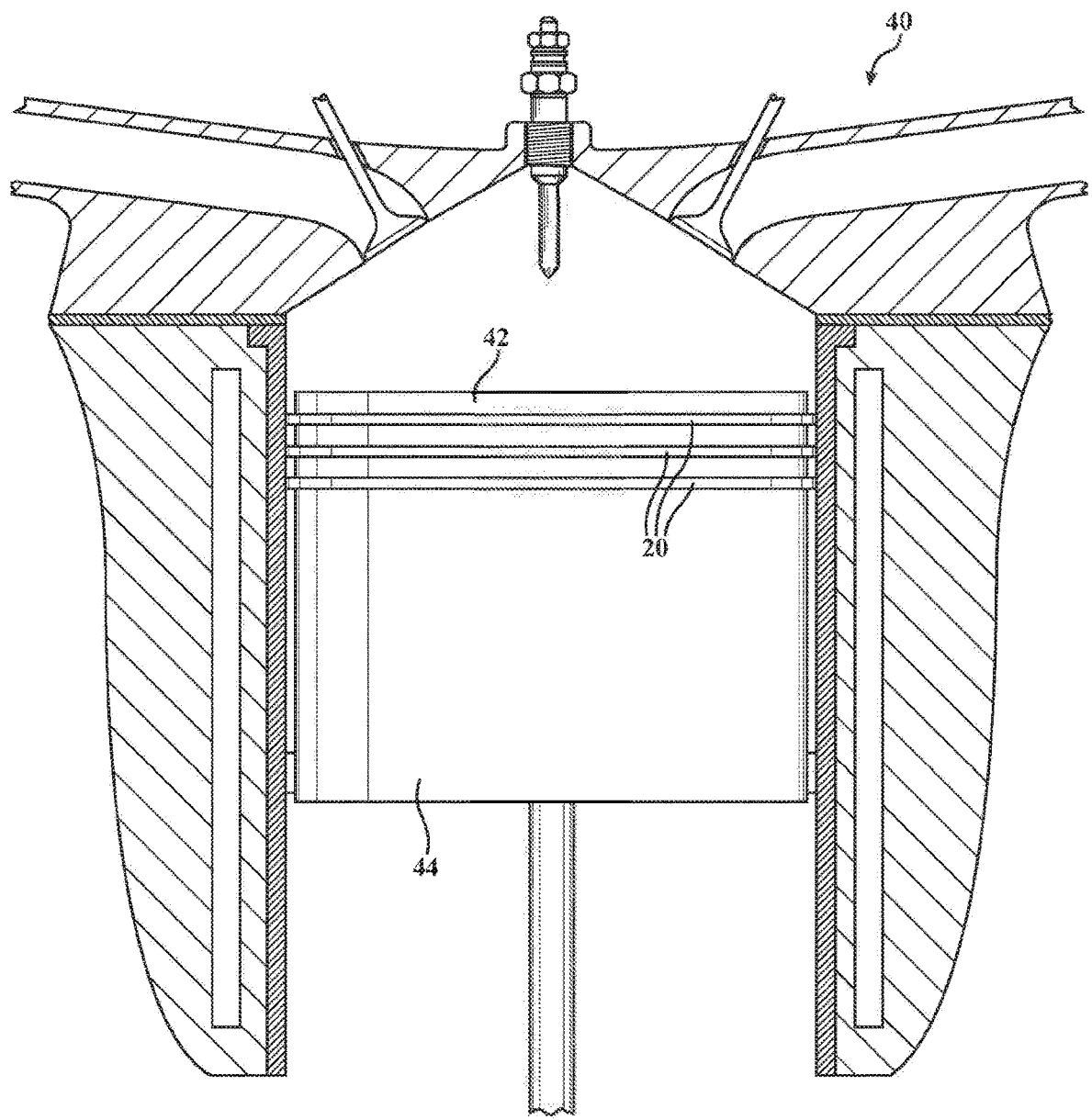
FIG. 3 is a sectional view of an internal combustion engine including a piston assembly with the piston ring of FIG. 1 according to an exemplary embodiment.

An exemplary embodiment of a piston ring 20 for an internal combustion engine is shown in FIG. 1. A coating 22 is disposed on rough sections of an outer surface 24 of the piston ring 20. Due to the rough outer surface 24 beneath the coating 22, the coating 22 less prone to crazing and flaking than comparative coatings on piston rings without the rough surface beneath the coating.

The piston ring 20 comprises a ring body extending circumferentially around a center axis A between opposite end surfaces 26. The ring body is formed of metal, for example steel. The end surfaces 26 of the ring body present a gap 28 therebetween. Typically, the end surfaces 26 are parallel to the center axis A, but the end surfaces 26 could be disposed at an angle relative to the center axis A. The outer surface 24 of the ring body faces away from the center axis A, and the ring body includes an inner surface 30 facing toward the center axis A. A top surface 32 extends from the inner surface 30 to the outer surface 24 of the ring body, and a bottom surface 34 is spaced from the top surface 32 and extends from the inner surface 30 to the outer surface 24. Typically, the inner surface 30 is parallel to the center axis A and the outer surface 24, and the top surface 32 is perpendicular to the center axis A and parallel to the bottom surface 34, but the surfaces could be disposed at different angles relative to one another.

The outer surface 24 of the ring body includes end sections 36 adjacent the end surfaces 26 and the gap 28. The end sections 36 of the outer surface 24 are rough, and the coating 22 is disposed on at least the rough end sections 36 of the outer surface 24. The end sections 36 are spaced from one another by a middle section 38 of the outer surface 24. In the example embodiment shown in FIG. 1, the middle section 38 is not coated with the coating 22. In this embodiment, the end sections 36 of the outer surface 24 have a surface roughness greater than a surface roughness of the middle section 38, and the middle section 38 of the outer surface 24 is considered to be smooth. However, in another embodiment, the entire outer surface 24, including the middle section 38, is coated with the coating 22. The rough sections of the outer surface 24, also referred to as textured surfaces, distribute stresses differently than smooth surfaces in a way that reduces flaking and crazing of the coating 22. The rough sections of the outer surface 24 also create a surface area that retains more oil on the piston ring 20.

The coating 22 applied to the end sections 36, and possibly to the entire outer surface 24, includes chromium nitride (CrN) or diamond-like carbon (DLC). The coating 22 may consist essentially of, or consist entirely of DLC or CrN. The coating 22 is formed of grains 46, and due to the rough surface, the grains 46 of the coating 22 are disposed at angles relative to one another.

Another aspect of the invention provides a method of manufacturing the coated piston ring 20. The method includes texturing the end sections 36 of the outer surface 24 located adjacent the end surfaces 26 of the ring body so that the end sections 36 of the outer surface 24 are rough; and applying the coating 22 to the rough end sections 36 of the outer surface 24. The texturing step can include blasting the outer surface 24 with a solid material, such as sand, to form the rough surface.

The coating step typically includes physical vapor deposition, especially when the coating 22 includes CrN, but other methods can be used to apply the coating 22. In the example embodiment, the middle section 38 includes no coating 22, so the method includes applying none of the coating 22 to the middle section 38 of the outer surface 24. For example, the method can include masking the middle section 38 of the outer surface 24 while applying the coating 22 to the end sections 36, so that the coating 22 is only disposed on the end sections 36. However, the coating 22 could be disposed on the entire outer surface 24. The method can also include masking the middle section 38 of the outer surface 24 while blasting or texturing the outer surface 24 in another manner, so that only the end sections 36 are textured. Alternately, the entire outer surface 24 could be rough, with or without the coating 22 on the middle section 38.

The coated piston ring 20 is preferably disposed on a piston body to form a piston assembly 40 for an internal combustion engine. The piston body can have various different designs, but typically includes a crown 42 and a skirt 44 depending from the crown 42. The piston body typically includes at least one ring groove extending circumferentially around the center axis A, and the piston ring 20 is disposed in one of the ring grooves. In the example embodiment, the crown 42 of the piston body includes a plurality of the ring grooves and at least one, and oftentimes more or all of the ring grooves, contain the piston rings 20.

Many modifications and variations of the present invention are possible in light of the above teachings and may be practiced otherwise than as specifically described while within the scope of the claims. It is also contemplated that all features of all claims and of all embodiments can be combined with each other, so long as such combinations would not contradict one another.

What is claimed is:

1. A method of manufacturing a piston ring comprising the steps of:
    providing a ring body extending circumferentially around a center axis between opposite end surfaces, the end surfaces presenting a gap therebetween, the ring body having an outer surface facing away from the center axis;
    selectively texturing end sections of the outer surface located adjacent the end surfaces so that the end sections of the outer surface have a roughness that is relatively greater than a roughness of a middle section of the outer surface intermediate the end sections; and
    applying a coating to the rough end sections of the outer surface, the coating including chromium nitride (CrN) or diamond-like carbon (DLC).

2. The method of claim 1, including applying the coating by physical vapor deposition.

3. The method of claim 2, wherein the coating includes CrN.

4. The method of claim 2, wherein the coating includes DLC.

5. The method of claim 2 including applying none of the coating to the middle section of the outer surface.

6. The method of claim 1, wherein the end surfaces of the ring body are parallel to the center axis, the ring body has an inner surface facing toward the center axis, the ring body has a top surface extending from the inner surface to the outer surface and a bottom surface spaced from the top surface and extending from the inner surface to the outer surface, the inner surface is parallel to the center axis and the outer surface, the top surface is perpendicular to the center axis and parallel to the bottom surface, the ring body is formed of steel, the coating consists essentially of DLC or CrN, and the coating includes a plurality of grains disposed at angles relative to one another being applied to the outer surface; and applying none of the coating to the middle section of the outer surface.

7. A method of manufacturing a piston assembly comprising the steps of:
    providing a piston body including at least one ring groove extending circumferentially around a center axis,
    providing a ring body extending circumferentially around the center axis between opposite end surfaces, the end surfaces presenting a gap therebetween, the ring body having an outer surface facing away from the center axis, the outer surface having end sections adjacent the end surface and a middle section intermediate the end sections,
    selectively texturing the end sections so that the end sections of the outer surface are rougher than the middle section,
    applying a coating to the rough end sections of the outer surface, the coating including chromium nitride (CrN) or diamond-like carbon (DLC), and
    disposing the coated piston ring in one of the at least one ring groove of the piston body.

8. The method of claim 7, wherein the coating is selectively applied to only the end sections and none of the coating is applied to the middle section of the outer surface.

\* \* \* \* \*